United States Patent
Wakamatsu et al.

(10) Patent No.: US 10,415,795 B2
(45) Date of Patent: Sep. 17, 2019

(54) METHOD OF MANUFACTURING LIGHT DISTRIBUTION MEMBER WITH SHIELDED INDIVIDUAL TRANSMISSIVE PIECES AND LIGHT-SHIELDING FRAME, METHOD OF MANUFACTURING LIGHT EMITTING DEVICE HAVING LIGHT DISTRIBUTION MEMBER, LIGHT DISTRIBUTION MEMBER, AND LIGHT EMITTING DEVICE

(71) Applicant: NICHIA CORPORATION, Anan-shi, Tokushima (JP)

(72) Inventors: Dai Wakamatsu, Anan (JP); Masatsugu Ichikawa, Tokushima (JP); Masahiko Sano, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 556 days.

(21) Appl. No.: 15/152,737

(22) Filed: May 12, 2016

(65) Prior Publication Data
US 2016/0334077 A1    Nov. 17, 2016

(30) Foreign Application Priority Data

May 15, 2015   (JP) .................................. 2015-099985
May 2, 2016    (JP) .................................. 2016-092633

(51) Int. Cl.
*F21V 11/06*    (2006.01)
*F21V 13/08*    (2006.01)
(Continued)

(52) U.S. Cl.
CPC ............ *F21V 11/16* (2013.01); *F21V 7/0083* (2013.01); *H01L 25/0753* (2013.01);
(Continued)

(58) Field of Classification Search
CPC .......... F21V 5/007; F21V 11/06; F21V 13/08; F21V 13/10; F21V 11/02; G02B 5/201; F21Y 2015/10
See application file for complete search history.

(56) References Cited

U.S. PATENT DOCUMENTS 3,041,228 A * 6/1962 MacLeod ................ G21K 4/00
156/250
5,371,434 A * 12/1994 Rawlings .................. G09F 9/33
313/505
(Continued)

FOREIGN PATENT DOCUMENTS

CN  103210509 A   7/2013
EP  2479812 A2    7/2012
(Continued)

OTHER PUBLICATIONS

Extended European Search Report of the corresponding European Patent Application No. 16169538.2, dated Jul. 13, 2016.

*Primary Examiner* — Ismael Negron
(74) *Attorney, Agent, or Firm* — Global IP Counselors, LLP

(57) ABSTRACT

A light distribution member includes a body and a light-shielding frame. The body includes a plurality of transmissive pieces and a plurality of light shield parts each interposed between adjacent ones of the transmissive pieces. Each of the transmissive pieces is made of a phosphor or made of a sinter of a phosphor and a binder composed of an inorganic substance. The light-shielding frame is provided so as to surround an outer edge periphery of the body. The light-shielding frame is made of a ceramic. The light distribution member contains substantially no organic substance inside the light-shielding frame.

19 Claims, 14 Drawing Sheets

(51) Int. Cl.
*F21V 11/16* (2006.01)
*H01L 25/075* (2006.01)
*H01L 33/50* (2010.01)
*H01L 33/60* (2010.01)
*F21V 7/00* (2006.01)
*H01L 33/64* (2010.01)

(52) U.S. Cl.
CPC ............ *H01L 33/505* (2013.01); *H01L 33/60* (2013.01); *H01L 33/507* (2013.01); *H01L 33/644* (2013.01); *H01L 2933/0041* (2013.01); *H01L 2933/0058* (2013.01)

(56) References Cited

U.S. PATENT DOCUMENTS

| | | | | |
|---|---|---|---|---|
| 5,819,454 A * | 10/1998 | Rosenitsch | ............... | G09F 9/33 40/452 |
| 6,252,243 B1 | 6/2001 | Isoda et al. | | |
| 6,441,389 B1 * | 8/2002 | Iwabuchi | ............... | G01T 1/2014 250/581 |
| 7,455,429 B2 * | 11/2008 | Barker | ............... | G09F 9/305 362/290 |
| 7,914,162 B1 * | 3/2011 | Huang | ............... | B60L 1/14 362/92 |
| 8,262,257 B2 * | 9/2012 | Deeben | ............... | H01L 33/508 362/249.02 |
| 8,328,391 B2 * | 12/2012 | Snijder | ............... | F21V 11/06 349/61 |
| 8,622,573 B2 * | 1/2014 | Kubis | ............... | H05B 33/0887 362/217.03 |
| 9,638,396 B2 * | 5/2017 | Kadomi | ............... | C09K 11/02 |
| 9,806,240 B2 * | 10/2017 | Goeoetz | ............... | H01L 33/508 |
| 2008/0112165 A1 * | 5/2008 | Mori | ............... | F21V 5/007 362/241 |
| 2009/0323332 A1 * | 12/2009 | Lo | ............... | F21K 9/00 362/235 |
| 2011/0044026 A1 | 2/2011 | Deeben et al. | | |
| 2012/0007131 A1 | 1/2012 | Ueno et al. | | |
| 2012/0236582 A1 | 9/2012 | Waragaya et al. | | |
| 2013/0170179 A1 | 7/2013 | Kadomi et al. | | |
| 2013/0240922 A1 | 9/2013 | Yamamoto | | |
| 2013/0329440 A1 | 12/2013 | Tsutsumi et al. | | |
| 2014/0376244 A1 | 12/2014 | Tsutsumi et al. | | |
| 2016/0013119 A1 | 1/2016 | Yamamoto | | |
| 2016/0268488 A1 | 9/2016 | Goeoetz et al. | | |

FOREIGN PATENT DOCUMENTS

| | | |
|---|---|---|
| EP | 2827048 A1 | 1/2015 |
| JP | 2000-155199 A | 6/2000 |
| JP | 2010-046696 A | 3/2010 |
| JP | 2012-119407 A | 6/2012 |
| JP | 2012-134355 A | 7/2012 |
| JP | 2012-169189 A | 9/2012 |
| JP | 2012-527742 A | 11/2012 |
| JP | 2013-187371 A | 9/2013 |
| WO | 2012-066881 A1 | 5/2012 |
| WO | 2012-086517 A1 | 6/2012 |
| WO | 2015-063077 A1 | 5/2015 |

* cited by examiner

… (1)

METHOD OF MANUFACTURING LIGHT DISTRIBUTION MEMBER WITH SHIELDED INDIVIDUAL TRANSMISSIVE PIECES AND LIGHT-SHIELDING FRAME, METHOD OF MANUFACTURING LIGHT EMITTING DEVICE HAVING LIGHT DISTRIBUTION MEMBER, LIGHT DISTRIBUTION MEMBER, AND LIGHT EMITTING DEVICE

CROSS-REFERENCE TO RELATED APPLICATIONS

This application claims priority to Japanese Patent Applications No. 2015-099985 and No. 2016-092633 filed on May 15, 2015 and May 2, 2016. The entire disclosures of Japanese Patent Applications No. 2015-099985 and No. 2016-092633 are hereby incorporated herein by reference.

BACKGROUND

1. Technical Field

The present disclosure relates to a method of manufacturing a light distribution member, a method of manufacturing a light emitting device, a light distribution member, and a light emitting device.

2. Description of Related Art

A light emitting device equipped with a plurality of light emitting diodes or other such light emitting elements has been used in the past as a light source utilized in automotive headlights. With this light emitting device used in automotive headlights, a plurality of light emitting elements are arranged on a substrate, and wavelength conversion members that contain a phosphor are disposed on these light emitting elements. With a light emitting device such as this, however, if there is an unlit light emitting element adjacent to a lit light emitting element when the lighting of the plurality of light emitting elements is controlled independently for each one, there may be light leakage from the wavelength conversion member provided to the lit light emitting element, and the wavelength conversion member provided to the unlit light emitting element may emit a tiny amount of light.

In view of this, methods have been proposed to prevent this light leakage, such as a method in which the outer periphery of one wavelength conversion member is covered by a white ceramic frame, and a method in which a reflective resin containing titanium oxide or the like is disposed between adjacent wavelength conversion members (see JP2012-134355A, JP2012-527742A, WO2012/66881A and JP2012-119407A).

However, forming the reflective resin requires a certain amount of space between wavelength conversion members. Meanwhile, when adjacent light emitting elements emit light at the same time, this space causes the boundary between the light emitting elements to become darker.

Also, when a light-shielding film composed of a metal film or a dielectric multilayer film is formed on the side surface of a flat wavelength conversion member, an adequate light shielding or reflecting effect cannot be obtained if the side surface is bumpy. Furthermore, it is not easy to control the film thickness in forming a metal film or a dielectric multilayer film on the side surface, and it is difficult to form the film evenly on the side surface.

Therefore, there has been a need for a method for easily, simply, and precisely manufacturing a light emitting device having functions added according to the number and layout of the light emitting elements and how they can be used.

SUMMARY

A method for manufacturing of a plurality of light distribution members includes
preparing a joined body in which a plurality of transmissive plates are joined with a light shield part being interposed between adjacent ones of the transmissive plates;
fixing a light-shielding frame to the joined body so as to surround an outer periphery of the joined body as seen from one direction; and
cutting the joined body and the light-shielding frame perpendicularly to a surface of the joined body to which the light-shielding frame is fixed thereby obtaining the plurality of the light distribution members each having a plurality of transmissive pieces.

Further, a method for manufacturing a light emitting device includes
manufacturing the light distribution member according to above; and
providing a plurality of light emitting elements that are spaced apart so that light from one of the light emitting elements is incident on one or more of the transmissive pieces.

A light distribution member includes
a joined body in which a plurality of transmissive pieces are joined with a light shield part being interposed between adjacent ones of the transmissive pieces; and
a light-shielding frame provided so as to surround an outer periphery of the joined body as seen from one direction.

Further, a light emitting device includes
the light distribution member according to the above;
a plurality of light emitting elements that are arranged on one of a pair of main surfaces of the light distribution member, the main surface being a surface on which the light-shielding frame is not provided, and that are arranged so that light from one of the light emitting elements is incident on one or more of the transmissive pieces of the light distribution member: and
a reflective member that is composed of a different material from that of the light-shielding frame and is provided so as to come into contact with the light shield part between the light emitting elements.

A light emitting device includes
the light distribution member according to the above; and
a semiconductor laser element arranged spaced apart from the light distribution member and arranged such that light from the semiconductor laser element is incident on one main surface of a pair of main surfaces of the light distribution member on which the light-shielding frame is not provided.

Disclosed herein is a light distribution member with which light leakage can be prevented between transmissive pieces provided to lit and unlit light emitting elements without decreasing emission efficiency, as well as a method for manufacturing the light distribution member and a light emitting device that have the same effect.

DETAILED DESCRIPTION

Figure 1A:
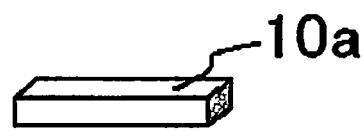
FIGS. 1A to 1F are schematic manufacturing step diagrams indicating an embodiment of a method for manufacturing a light distribution member of the present disclosure.

In the present disclosure, the sizes and the arrangement relationships of the members in each of drawings are occasionally shown exaggerated for ease of explanation. In the description below, the same reference numerals may, in principle, denote the same or similar members and duplicative description is appropriately omitted. Further, constitutions described in examples and the embodiments can be employed in other examples and embodiments.

Method for Manufacturing Light Distribution Member

A method for manufacturing a light distribution member in this embodiment includes preparing a joined body in which a plurality of transmissive plates are joined with light shield part interposed between adjacent transmissive plates, fixing a light-shielding frame to the joined body so as to surround an outer periphery of the joined body as seen from one direction, and cutting the joined body and the light-shielding frame perpendicular to the surface of the joined body to which the light-shielding frame is fixed, thereby obtaining a plurality of light distribution members each having a plurality of transmissive pieces. The joined body here can be a first joined body in which a plurality of transmissive plates having pairs of main surfaces on mutually opposite sides are joined so that their main surfaces are opposite each other. Also, the joined body can be, for example, a second joined body in which a plurality of transmissive plates having a cuboid shape are joined in a matrix form. Here, "as seen from one direction" means seeing from normal direction to one surface of the jointed body.

1. Preparation of Joined Body

First Light-Shielding Film Member

First, a plurality of first light-shielding film members are prepared in which at least one surface of the transmissive plates is covered with a first light-shielding film.

The transmissive plates used here may be either flexible or rigid, so long as they are plate members that are transmissive.

The "one surface" here means a main surface accounting for the greatest surface area of a transmissive plate, such as the front or rear surface.

Examples of this transmissive plate include one molded from a silicone resin, a modified silicone resin, an epoxy resin, a phenol resin, a polycarbonate resin, an acrylic resin, a TPX resin, a polynorbornene resin, a hybrid resin containing one or more of these resins, or other such resins, as well as glass or the like.

The transmissive plate may contain a phosphor (to be precise, a plurality of phosphor particles), a filler, or the like, so long as it is transmissive. In the case that the transmissive plate contains a phosphor, there is the risk that the phosphor generates heat, which diminish the characteristics of the phosphor itself. Accordingly, the improvement in heat dissipation resulting from providing the light-shielding frame is more pronounced in the case that the transmissive plate contains a phosphor.

As the phosphor, one known in the art can be used. Examples include particles of yttrium-aluminum-garnet (YAG)-based phosphors activated by cerium, lutetium-aluminum-garnet (LAG)-based phosphors activated by cerium, nitrogen-containing calcium aluminosilicate ($CaO$—$Al_2O_3$—$SiO_2$)-based phosphors activated by europium and/or chromium, silicate $((Sr, Ba)_2SiO_4)$-based phosphors activated by europium, β-sialon phosphors, nitride-based phosphors such as CASN-based or SCASN-based phosphors and KSF-based phosphors ($K_2SiF_6$:Mn). These may be used singly or in combinations of two or more. The amount of the phosphors in the transmissive plate is preferably in a range of 5 to 50% with respect to the total weight of a material of the transmissive plate. The transmissive plate can be a phosphor itself, or a sinter of a phosphor and a binder composed of an inorganic substance. This affords a transmissive plate can excellent heat resistance.

As the filler (for example, a dispersing agent, a coloring agent, and the like), for example, includes particles of silicon oxide, titanium oxide, zirconium oxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide.

The planar shape of the transmissive plate is preferably a quadrangular shape, such as a rectangular shape. In this Specification, "a rectangular shape" includes a square shape. The shape of the transmissive plate here becomes cuboid (including a cube).

The thickness and size of the transmissive plate can be suitably adjusted according to the type of light distribution member to be obtained. For instance, the thickness of the transmissive plate (the length in the up and down direction in FIG. 1A) corresponds to the spacing between light emitting elements and/or the size of the light emitting elements when used as a light distribution member in a light emitting device, and this thickness is preferably equal to or slightly greater than the outer periphery of the light emitting elements. More specifically, an example of the thickness is in a range of about 100 μm to a few millimeters, with a range of about 100 to 1000 μm being preferable, and about 100 to 500 μm being more preferable. Consequently, when the resulting light distribution member is used in a light emitting device, in addition to making the light emitting device more compact, higher brightness can also be obtained.

The first light-shielding film is preferably formed from a material capable of shielding at least 80% of the light from a light emitting element. A single layer composed of a metal, a multilayer film composed of metal, or a multilayer film composed of dielectric (dielectric multilayer film) in which two or more types of dielectric are laminated can be used as the first light-shielding film. A dielectric multilayer film can be used to make a DBR (distributed Bragg reflector) film, for example. It is especially preferable to use a film that includes a dielectric multilayer film. In the case that a dielectric multilayer film is used, there can be less absorption of light from the transmissive pieces, and the light can be reflected more efficiently, than with a metal or the like. In the case that both a metal film and a dielectric multilayer film are used as the first light-shielding film, the dielectric multilayer film and the metal film preferably are disposed in this order from the transmissive plate side. This allows the efficiency of light extract from the transmissive piece to be improved.

Examples of metal include gold, silver, copper, iron, nickel, chromium, aluminum, titanium, tantalum, tungsten, cobalt, ruthenium, tin, zinc or an alloy thereof (e.g., Al alloy such as an alloy of Al and Cu, Ag or Platinum Group Metal such as Pt).

Examples of dielectric include nitrides or oxides containing one or more elements selected from the group consisting of silicon, titanium, zirconium, niobium, tantalum, and aluminum. With a dielectric multilayer film constituting a DBR film, usually, if we let n1 be the refractive index of one dielectric, n2 be the refractive index of the other dielectric, and λ be the wavelength of light emitted from the light emitting layer, then the thickness d1 of the one dielectric and the thickness d2 of the other dielectric are preferably as follows.

$$d1=\lambda/(4 \times n1) \quad (1)$$

$$d2=\lambda/(4 \times n2) \quad (2)$$

The thickness of the first light-shielding film is, for example, in a range of about a few tenths of a micron to about a few dozen microns, in a range about 0.1 to 10 μm being preferable, and in a range of about 0.3 to 7 μm being more preferable. Using a film whose thickness has the lower limit mentioned above allows the first light-shielding film to be formed uniformly within the same plane, and the light to be reliably reflected by the first light-shielding film, and using a film whose thickness as the upper limit mentioned above allows the spacing between transmissive plates to be reduced, so there can be less unevenness in the light emitted by the first light-shielding films.

The first light-shielding film can be formed by a known method, such as vacuum vapor deposition, ion plating, ion vapor deposition (IVD), sputtering, ECR sputtering, plasma deposition, chemical vapor deposition (CVD), ECR-CVD, ECR-plasma CVD, an electron beam deposition (EB), atomic layer deposition (ALD). It is particularly preferable to form the first light-shielding film by sputtering method which requires a relatively short operation time.

In the case that each transmissive plate is cuboid and the first joined body is composed of two transmissive plates, the first light-shielding film may be formed on only one surface of the transmissive plate. In the case that each transmissive plate is cuboid and the first joined body is composed of three or more transmissive plates, the first light-shielding film are formed on at least two opposing surfaces (that is, the front and rear surfaces) of one or more transmissive plates located between the transmissive plates at the two ends. Also, the first light-shielding film can be formed on four surfaces of the transmissive plate, excluding a surface on which light from a light emitting element is incident and a surface from which the light of a light emitting element is emitted. With this arrangement, at the time of obtaining light distribution members by cutting the first joined body, the first light-shielding film is formed over the entire side surfaces of the transmissive piece, and allows light to be reflected laterally. The first light-shielding film may be formed partly in the form of a lattice, stripes, or the like, but preferably formed entire surface of one surface of the transmissive plate in a uniform thickness overall.

In the case that a plurality of first light-shielding film members are prepared, they may either have different planar shapes and thicknesses, or same or substantially same planar shapes and thicknesses. The term "substantially" here means that variance of about ±10% is allowed.

Figure 7A:
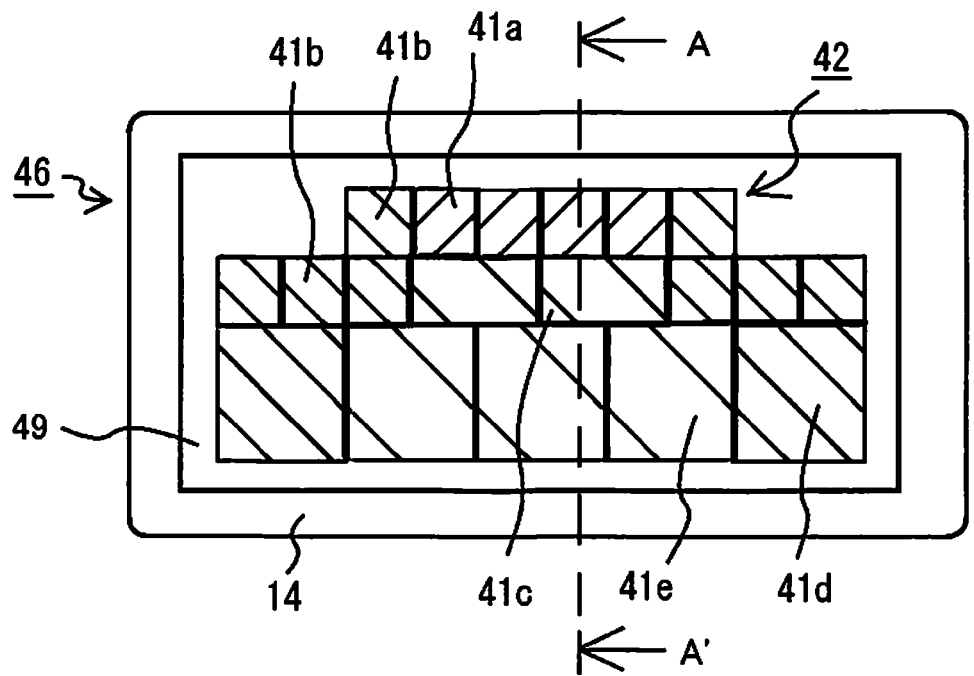
FIG. 7A is a schematic plan view of a light emitting device obtained in further another embodiment of a method for manufacturing the light emitting device of the present disclosure.
Figure 7B:
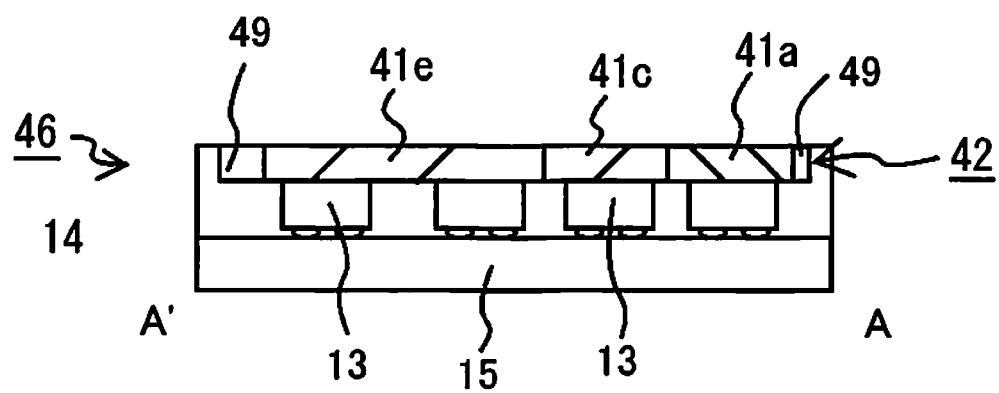
FIG. 7B is a schematic cross section along the A-A' line in FIG. 7A.

For example, when two types of first light-shielding film member are prepared, namely, a thin first light-shielding film and a thicker first light-shielding film, the product of joining a plurality of the thin first light-shielding film members preferably has the same thickness as one thicker first light-shielding film member. That is, a thin first light-shielding film member preferably corresponds to one-half or one-third the thickness of a thicker first light-shielding film member. This allows a light distribution member to be formed which has transmissive pieces of different size in the row or column direction. Furthermore, in the formation of a second joined body, a light distribution member having transmissive pieces of different size in the row and column directions as shown in FIGS. 7A and 7B can be formed by combining and laminating second light-shielding film members having transmissive pieces of different size in the row or column direction.

The first light-shielding film members may be cut, polished, etc., to achieve the desired shape, size, and so forth after forming the first light-shielding film on each transmissive plate.

In the next step, when first light-shielding film members are joined using normal-temperature joining (atomic diffusion joining), it is preferable to smooth the surface of the transmissive plate before forming the first light-shielding film.

Formation of First Joined Body

A plurality of first light-shielding film members are joined so that the first light-shielding films are opposite each other to form a first joined body.

This joining may be done with an adhesive agent, or by melt joining involving the heating of the first light-shielding films. Preferably, a film containing a metal is used as the first light-shielding film, and the films containing a metal are brought into contact with each other and directly joined. Since direct joining allows the distance between adjacent transmissive plates to be reduced, light is less apt to be shielded by the first light-shielding film when used in combination with light emitting elements, and emission unevenness can be reduced. Joining at normal temperature is preferred as the direct joining method. In this specification, the members disposed between adjacent transmissive plates are called "light shield part." For example, when a first light-shielding film provided to one transmissive plate is directly joined to a first light-shielding film provided to another transmissive plate that is adjacent to the first transmissive plate, the product of joining these two light-shielding films is called a "light shield part." When a first light-shielding film provided to one transmissive plate is joined with an adhesive to a first light-shielding film provided to another transmissive plate, the product of two light-shielding films and the adhesive is also called a "light shield part." The same applies to when the second light-shielding film (discussed below) is used.

A known method can be used for the normal-temperature joining. Examples thereof include a surface activated joining type of normal-temperature joining and an atomic diffusion type of normal-temperature joining. When this normal-temperature joining is performed, joining can be accomplished without the use of an adhesive, heat, or the like, so a strong joint can be obtained without having to take into account the difference in coefficients of thermal expansion between the two members being joined. Also, since the joining occurs on the atomic level, the strength is higher than with bonding using an adhesive or the like, and the joint can have superior durability. Furthermore, because no heating is entailed, the temperature does not have to be raised or lowered, so joining can be completed in a short time.

With the surface activated joining type of normal-temperature joining, surface processing of the joint surfaces in a vacuum creates an active state in which chemical bonds readily form with the atoms on the surface. More precisely, first any oxide films, dirt, or the like adhering to the joint surface is removed in a vacuum by irradiation with argon or other ions or a plasma, for example. The energy, duration, and so forth here can be suitably adjusted according to the thickness, material, and so on of the first light-shielding film of the first light-shielding film members being used. This processing exposes atoms having bonds at the joint surfaces of the first light-shielding film member, and allows an extremely active state with a high joint strength with other atoms to be created. Consequently, when the joint surfaces are brought into contact, the bonding force comes into play instantly, allowing the joint surfaces to be securely joined together. With joining such as this, no thermal distortion or thermal stress is caused by heating, so a stable joint can be obtained with extremely thin first light-shielding film.

With atomic diffusion normal-temperature joining, the first light-shielding film is formed in a super-high vacuum at the joint surface of the transmissive plate, and these first light-shielding films are superposed in a vacuum so as to surface each other, which allows the joint surfaces to be joined at normal temperature. When atomic diffusion normal-temperature joining is performed, of the above-mentioned materials that can be used as the first light-shielding film, titanium, gold, chromium or the like is preferable because of their excellent corrosion resistance.

In the joining of the first light-shielding film members, the first light-shielding film member located at the most end may be one in which the first light-shielding films are formed on two sides, but it is preferable to use a first light-shielding film member in which the first light-shielding film is formed on one surface, so that the first light-shielding film may not be disposed on the endmost surface. Also, the first light-shielding film members disposed to the inside in the first joined body may have first light-shielding films formed on one surface, but it is preferable to use first light-shielding film members in which the first light-shielding films are formed on two surfaces, in order to facility joining on both sides.

In the case that an adhesive agent is used for the joining of the first light-shielding film members, an acrylic-based, an urethane-based, a styrene-based, an epoxy-based, a polyimide-based, a silicone-based, a BT resin-based, an ester-based, an ether-based, an urea-based, a polyamide-based, a phenol-based or a cellulose derivative-based can be used as the adhesive agent. These may be used singly or in combinations of two or more.

In any case, the first joined body can be formed by joining first light-shielding film members so that one or both first light-shielding films are opposite each other. Examples of the number of laminations of the first light-shielding film member in the first joined body include two or more, three or more, four or more, and five or more. Also, examples of the number of laminations of the first light-shielding film member in the first joined body include a hundred or fewer, several dozen or fewer, and about a dozen or fewer. Preferably, the number of laminations of the first light-shielding film member in the first joined body is at least 2 and at most 10. Light distribution member comprising a plurality of transmissive pieces can be formed at once by keeping to at least the above-mentioned lower limit, and the cutting of the first joined body can be facilitated by keeping to at most the above-mentioned upper limit.

2. Fixing of Light-Shielding Frame

A light-shielding frame is formed on the first joined body thus obtained. The light-shielding frame referred to here may surround a part of the outer periphery of the first joined body, but preferably surrounds the entire outer periphery as seen in one direction. This allows the light-shielding frame to shield the light going out laterally from the first joined body, so light can be prevented from escaping laterally from the light distribution member. The light-shielding frame is preferably light reflective. This allows light going out laterally from the light distribution member to be reflected and extracted, so the efficiency of light extract from the light distribution member can be improved. The "outer periphery" referred to here means the side surfaces of the first joined body, constituted by the pair of side surfaces of the first joined body that are parallel to the joint surface of the first light-shielding film member, and the side surfaces adjacent thereto. That is, it refers to all of the surfaces except for two opposing surfaces, and when the first joined body is cuboid, it refers to four surfaces excluding the two opposing surfaces. Also, "part of the outer periphery" may be just one side surface, or a pair of opposing side surfaces, or a portion of one or a pair of side surfaces. Because of the shape of the transmissive plate that is usually used, the first joined body is in the form of a quadrangular column or an approximate shape, and therefore the pair of side surfaces parallel to the joint surface are preferably continuous with the pair of side surfaces that intersect (and preferably are perpendicular to) the joint surface, and surround the entire width and length of the side surfaces of the first joined body.

The material constituting the light-shielding frame is one that contains substantially no organic substances. In the case that a member containing organic substance is provided in a region directly contacting the transmissive plate, there is a risk that the cracking in the member contacting the transmissive plate may occur due to high-density light and so forth. When cracking occurs, light may escape from the cracking area, and luminance of the light emitting device may decrease. In contrast, since the light-shielding frame that contains substantially no organic substance is provided to the outer periphery of the joined body, cracking around the outer periphery of the joined body can be more easily suppressed, and a light emitting device with high luminance can be obtained. The phrase "contains substantially no organic substance" as used here means not only that no organic substance is contained, but also that organic substance is contained in an amount small enough not to affect the reliability of the light-shielding frame. Examples of such a material include light reflective ceramic, dielectric multilayer film, glass containing a light reflective substance, metal, and composite materials of these. Since these materials do not contain organic substance, the resulting the cracking of the light-shielding frame due to heat or light can be suppressed. It is especially preferable to use light reflective ceramic with excellent resistance to heat and light. The light reflective ceramic for use may be material with high heat dissipation characteristics such as aluminum nitride, alumina, and the like. Examples of the materials for the light reflective substances include titanium oxide, silicon oxide, zirconium oxide, potassium titanate, alumina, aluminum nitride, boron nitride, and mullite. The amount in which the light reflective substance and so forth are contains can be suitably adjusted according to the type of light reflective substance being used and other such factors. For instance, it is preferable for the amount to be about 30% or higher with respect to the total weight of the material of the light-shielding frame.

The method for forming the light-shielding frame on the first joined body may be the same as the method for joining the first light-shielding film members, or a ceramic green sheet may be used to cover the outer periphery of the first joined body and then sintered, or a sintered ceramic may be affixed with an adhesive agent or the like. Preferably, a sintered ceramic is fixed by the same method as that used to join the first light-shielding film members. This is a simple way to form the light-shielding frame around the outer periphery of the first joined body. The use of these methods can be securely fix the light-shielding frame around the outer periphery of the first joined body.

The thickness of the light-shielding frame can be preferably in a range of 50 μm to 1000 μm, and more preferably in a range of 100 μm to 500 μm. In the case that the thickness is kept to at least the above-mentioned lower limit, the lateral leakage of light from the light distribution member can be suppressed, and in the case that the thickness is kept to at most the above-mentioned upper limit, the cutting of the first joined body can be facilitated in a subsequent step. The term "thickness of the light-shielding frame" as used here indicates the length from the joint surface between the light-shielding frame and the first joined body to the surface of the light-shielding frame opposite the joint surface. That is, "thickness of the light-shielding frame" indicates the length L in the left and right direction or the up and down direction in FIGS. 1D and 1F.

3. Cutting of First Joined Body and Light-Shielding Frame

The resulting first joined body and light-shielding frame are cut. The cutting here is preferably performed perpendicular to the joint surfaces of the first light-shielding film members and the surfaces to which the light-shielding frame is fixed. That is, it is preferably performed perpendicular to all of the surfaces to which the light-shielding frame is fixed. Hereinafter, this cutting referred to as the first cutting. The first cutting yields light distribution member in which the light-shielding frame is fixed around the outer periphery, including pieces of transmissive plates (hereinafter referred to as "transmissive pieces") in a state of having been parted at the first light-shielding films.

This first cutting may be any kind of cutting, so long as it is made perpendicular to the joint surfaces of the first light-shielding film members and all of the surfaces to which the light-shielding frame is fixed, but it is preferable to use a cutting method in which the cutting surface is flat. Any method that is known in this field can be used to this cutting method. Examples include blade dicing, laser dicing, and cutting with a wire saw. Using a wire saw is particularly preferable because the first light-shielding film members can be cut at once. In this Specification, "perpendicular" encompasses a slope of within ±10%.

Figure 1B:
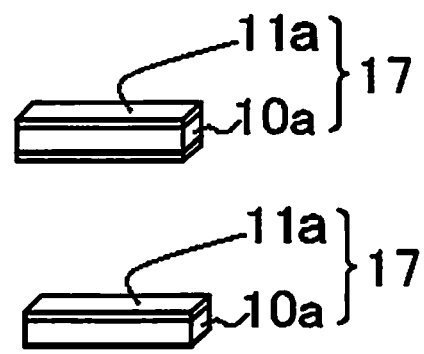
Figure 1C:
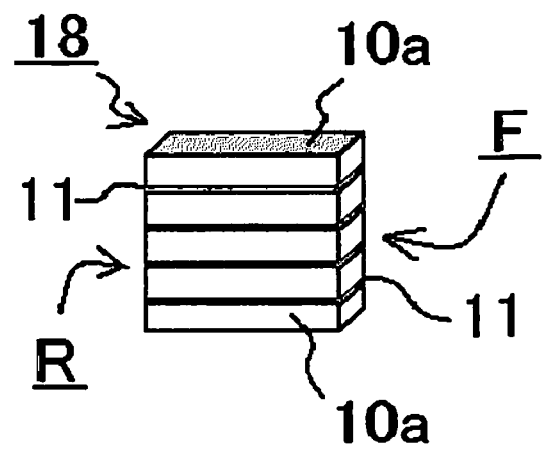
Figure 1D:
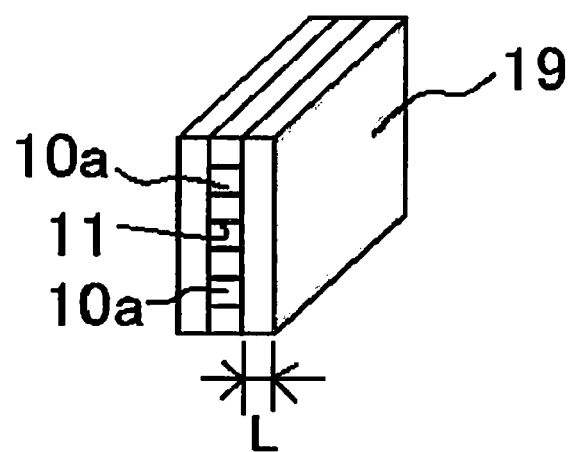
Figure 1E:
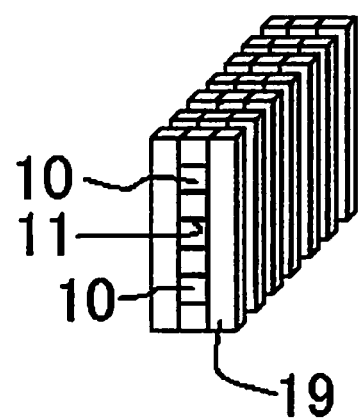

In the case that the planar shape of the transmissive plates is quadrangular, the first cutting is preferably performed so as to obtain a cutting surface (such as the end surface F or R in FIG. 1C) that is parallel to a side surface adjacent to the surface on which a first light-shielding film is formed (see FIG. 1E, for example). This cutting in a first direction forms thin slices of the first joined body with a uniform thickness (see FIGS. 1E and 1F).

The desired light distribution member can be manufactured by performing cutting perpendicular to the joint surfaces of the first light-shielding film members and the surfaces to which the light-shielding frame is fixed just one time in one direction. A plurality of the desired light distribution members can be manufactured by making parallel cuts two or more times in the same way (see FIGS. 1E and 1F).

Figure 3A:
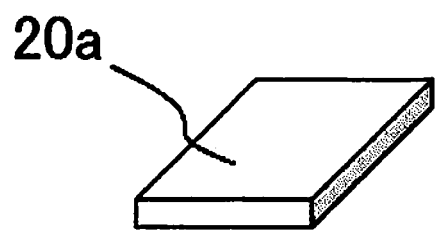
FIGS. 3A to 3G are schematic manufacturing step diagrams indicating another embodiment of a method for manufacturing a light distribution member of the present disclosure.
Figure 3B:
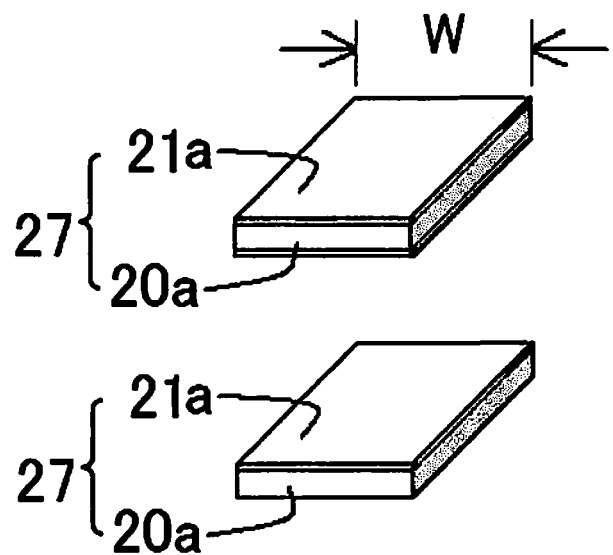
Figure 3C:
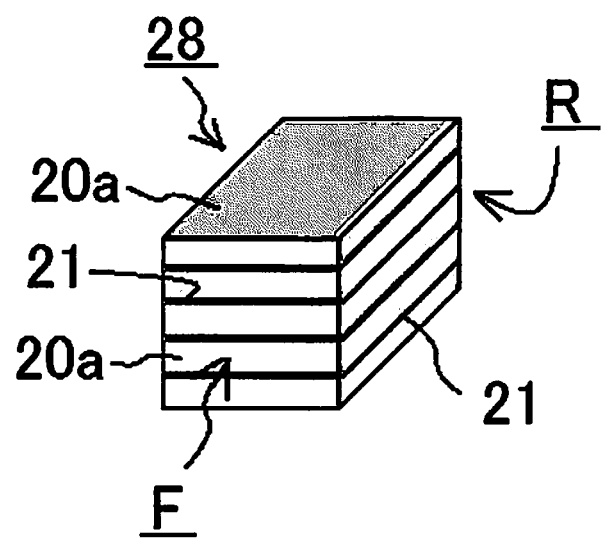
Figure 3D:
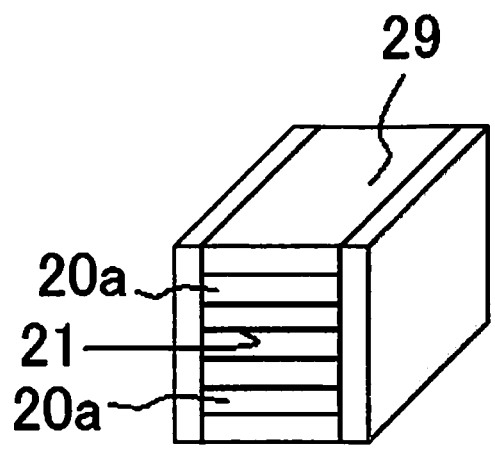
Figure 3E:
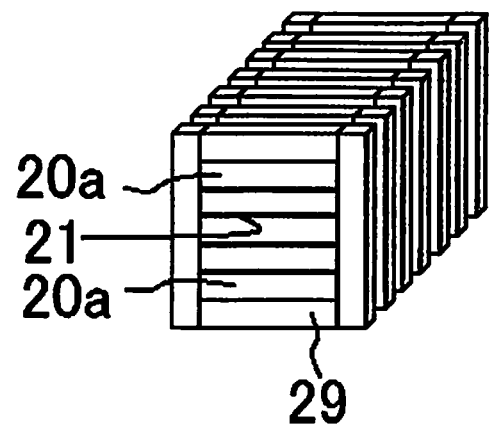
Figure 3F:
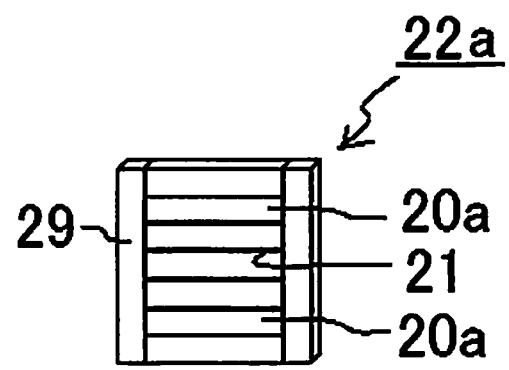
Figure 3G:
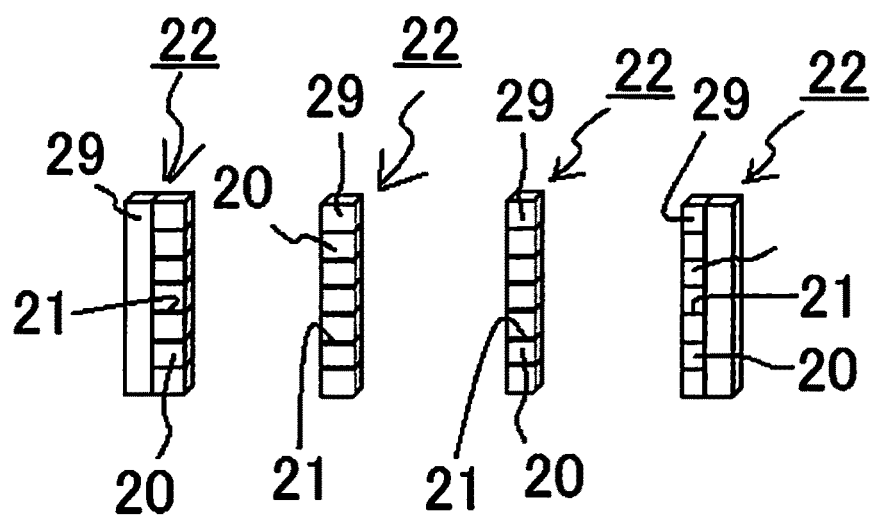

Also, as discussed above, the cutting may be performed perpendicular to the joint surfaces of the first light-shielding film members and the surfaces to which the light-shielding frame is fixed, and with respect to the light distribution members obtained by the parallel first cut, either once or two or more times, in a direction perpendicular to the joint surfaces of the first light-shielding film members and the surfaces to which the light-shielding frame is fixed, and in a direction that intersections (and preferably is perpendicular to) the first cut (FIG. 3G). Thus making cuts in two directions allows a plurality of light distribution members of the desired shape to be manufactured regardless of the shape of the joined body.

The cutting here preferably reduces the thickness to about the same as that of the transmissive plates being used, such as a range of about 100 μm to a few millimeters, or about 100 to 1000 μm or about 100 to 500 μm.

After cutting, polishing or the like may be performed to achieve these thicknesses.

The cutting in this step may be performed at an angle, rather than perpendicular to the joint surfaces of the first light-shielding film members and the surfaces to which the light-shielding frame is fixed. Such cutting can be utilized when manufacturing light distribution members that distribute light in a particular direction.

4. Preparation of Second Jointed Body

Formation of Second Light-Shielding Film Member

As discussed above, with the method for manufacturing a light distribution member according to an embodiment of the present disclosure, second light-shielding film may be further formed on the cut surface of the light distribution member obtained by the first cutting. That is, the light distribution members obtained by the first cutting are considered to be the above-mentioned transmissive plates, and the second light-shielding film is formed on the surface thereof. This allows one or more second light-shielding film members to be formed. Therefore, the second light-shielding film is formed so as to be alternately perpendicular to the first light-shielding films.

In this step, the transmissive plates preferably do not have the above-mentioned light-shielding frame formed on transmissive plates, but some of them may have the light-shielding frame formed. In the former case, of the above-mentioned steps, the formation of the light-shielding frame is not performed after the first joined body has been obtained by preparing and joining the first light-shielding film members, and the first joined body is cut perpendicular to the joint faces of the first light-shielding film members.

The second light-shielding film can be formed by the above-mentioned known methods, from the materials listed as examples for the first light-shielding film. It is especially preferably for the second light-shielding film to be formed from the same material as the first light-shielding film. This affords uniform light distribution characteristics from each light emitting element when a plurality of light emitting elements are used, as discussed below.

The second light-shielding film need not have the same thickness as the first light-shielding film, but from the standpoint of making the light distribution characteristics more uniform, it is preferable for the thickness to be the same.

Formation of Second Joined Body

The method for forming the second joined body by joining the second light-shielding film members can be the same as the method discussed above for forming the first joined body. This gives a joined body in which transmissive plates are joined in a matrix with light shield part interposed. The number of laminations of the second light-shielding film members here can be set as desired.

5. Fixing of Light-Shielding Frame on Second Joined Body

A light-shielding frame is formed on the resulting second joined body. The method for forming the light-shielding frame on the second joined body can be substantially the same as the method described for forming the light-shielding frame on the first joined body.

6. Cutting of Second Joined Body

The resulting second joined body and light-shielding frame are cut. The cutting here is preferably performed by the same method as that described for the cutting of the first joined body and the light-shielding frame.

The cutting here may be performed perpendicular to the joint surfaces of the second light-shielding film members, but is preferably performed perpendicular to all of the surfaces to which the light-shielding frame is fixed. That is, it is preferable to cut perpendicular to both the joint surfaces of the first light-shielding film members and the joint surfaces of the second light-shielding film member. However, in the cutting of the second joined body, in the case that the light-shielding frame is fixed to both end surfaces of the second joined body (the endmost surfaces), the light-shielding frame is preferably removed from those two end surfaces. That is, in the base that the light-shielding frame is fixed to all of the surfaces of the second joined body, the light-shielding frame provided to two opposing surfaces is preferably removed. For example, the light-shielding frame may be removed by cutting at the interface between the light-shielding frame and the second joined body, or may be removed the pieces at both ends where the second joined body has been cut.

The cut light distribution members can be further cut, as dictated by the shape of the transmissive plates, the number of laminations of the first light-shielding film members, how the first joined body is cut, the number of laminations of the second light-shielding film members, how the second joined body is cut, and so forth, thereby working to the desired shape and the desired number of transmissive plates, first light-shielding films, and second light-shielding films. Consequently, light distribution member in which a light-shielding frame is fixed to the outer periphery can be manufactured corresponding to the number of light emitting elements being used. In the resulting light distribution member, it is preferable that substantially no organic substance is contained in the member between the joined body and the light-shielding frame and the light shield part the inside of the light-shielding frame. In the case that organic substance is contained, there is the risk that heat produced at the transmissive pieces may end up accumulating in the members that contain the organic substance, and heat cannot be dispersed as well. In contrast, when substantially no organic substance is contained on the inside of the light-shielding frame, heat can be easily dispersed to the light-shielding frame, and there can be less of a decrease in heat dissipation in the light distribution member.

After the first cut has been made on the first joined body, after a cut has been made in a direction that intersects the first cut, or after the second cut has been made, the small pieces of transmissive plate that constitute the resulting light distribution member and are segmented by light shield part (first light-shielding films, or first light-shielding films and second light-shielding films) are hereinafter sometimes be referred to as "transmissive pieces" (see 10 in FIGS. 1E and 1F, 20 in FIGS. 3G, and 20 in FIGS. 5F and 5G).

By thus making a first cut in the first joined body, or making a cut in a direction that intersects the first cut, or cutting the second joined body, it is possible to simply, easily, and accurately manufacture light distribution members that are equipped with transmissive pieces that have cuboid shape or parallelepiped shape and have a uniform thickness, a light shield part that is capable of blocking light between transmissive pieces adjacent in the column direction and/or the row direction, and a light-shielding frame around an outermost periphery of the transmissive pieces and the light shield part.

Method for Manufacturing Light Emitting Device

Layout of Light Emitting Elements

With the method for manufacturing a light emitting device according to an embodiment of the present disclosure, light emitting elements are arranged to the light distribution member formed by the method discussed above. An LED can be used here an example to describe the light emitting element. The light distribution member is disposed on the light extraction side of the light emitting elements, that is, on the light extraction side of the light emitting device.

A plurality of light emitting elements are disposed spaced apart so that light from one light emitting element can be incident on one or more transmissive pieces.

For example, when using light distribution member in which transmissive pieces segmented at light shield part is arranged in a row, a plurality of light emitting elements are arranged in a row so that light from one light emitting element can be incident on one or more transmissive pieces. When using light distribution member in which transmissive pieces segmented at light shield part is arranged in a matrix, a plurality of light emitting elements are arranged in a matrix so that light from one light emitting element can be incident on one or more transmissive pieces. It is preferable here for the light distribution member to be disposed so that light from one light emitting element can be incident on one transmissive piece, but when the size of one transmissive piece is smaller than that of one light emitting element, then the light distribution member may be disposed so that light from one light emitting element is incident on a plurality of transmissive pieces. This prevents the light from the adjacent light emitting element in a lit state from leaking to the transmissive piece provided to adjacent light emitting element in an unlit state. As a result, the phenomenon whereby transmissive piece provided to unlit light emitting element emit a tiny amount of light can be prevented by the simple manufacturing method discussed above.

Also, the leakage of light in the lateral direction of the transmissive pieces provided to the light emitting elements located at the outermost ends can be prevented by the light-shielding frame, thus obtaining good light distribution. Furthermore, heat dissipation from the transmissive pieces can be improved by using a material with good heat dissipation properties, such as a ceramic.

With the plurality of light emitting elements that are arranged, it is preferable for adjacent light emitting elements to be in close proximity to each other. When automotive lighting applications, as well as luminance distribution and so forth are taken into account, it is preferable for the spacing between one light emitting element and an adjacent light emitting element to be less than the size of the light emitting element itself (for example, a length along one side of the light emitting element). For instance, this spacing is preferably in a range of at most about 30%, and more preferably in a range of at most 20%, of the size of the light emitting element itself. More specifically, the spacing is preferably in a range of at least 5 μm and at most 500 μm, and more preferably in a range of at least 50 μm and at most 200 μm. Since reflective member (described below) and so forth can be more easily disposed between the light emitting elements when the spacing is at least the above-mentioned lower limit, the leakage of light from lit light emitting element to adjacent unlit light emitting element can be suppressed, and a light emitting device that has high emission quality and little emission unevenness can be obtained by setting the spacing at most the above-mentioned upper limit.

As for the layout of the light emitting elements with respect to the light distribution member, the light emitting elements may be disposed apart from the light distribution member, but it is preferable for the light emitting elements to be disposed in close proximity to or in contact with the light distribution member. This allows light that emitted from the light emitting elements to a light distribution member side to be efficiently guided to the light distribution member. The term "close proximity" here basically means that only something (for example, a transmissive adhesive agent or a microcrystalline thin-film) contributing to the bonding of two members is interposed therebetween.

When the light emitting element is disposed in contact with the light distribution member, it is preferable to use surface activated type of normal-temperature joining. This allows the light emitting element and the light distribution member to be joined without any other members interposed between the light emitting element and the light distribution member, so it is less likely that light can be absorbed by other members.

When the light distribution member and light emitting elements are joined by atomic diffusion normal-temperature joining, it is necessary to form a microcrystalline thin-film on the light emitting elements and the light distribution member in a thickness that can be transmitted light. For instance, in terms of film formation rate, this can be in a range of at least 0.1 nm and at most 0.8 nm, preferably in a range of at least 0.1 nm and at most 0.4 nm, and more preferably in a range of at least 0.1 nm and at most 0.2 nm.

The phrase "in terms of the film formation rate" used in this Specification now is explained. First, a microcrystalline thin-film is formed for a predetermined time on a base having a flat surface. Next, a reaction time to obtain a desired thickness of microcrystalline thin-film is determined on the basis of the relation between this predetermined time and the thickness of the microcrystalline thin-film actually have been obtained. Accordingly, when a microcrystalline thin-film is formed for this predetermined time, it is assumed that a microcrystalline thin-film of the desired thickness corresponding to this predetermined time is formed in terms of the film formation rate. That is, the thickness assumed to be obtained based on the predetermined is used as the thickness formed in terms of the film formation rate. The above-mentioned range includes values smaller than a single atom, in this case the microcrystalline thin-film is formed as not a continuous film per se but an islands film. Therefore, even though the actual film thickness is not included in the above-mentioned thickness range, it may be considered to be within the range of the present disclosure so long as it is formed in the above-mentioned film thickness range in terms of the film formation rate. Also, when surface activation joining is used, the light emitting elements and the light distribution member are joined in direct contact. With surface activation joining, since there is no material that absorbs light in between the transmissive pieces and the light emitting elements, light from the light emitting elements can be incident on the transmissive pieces more efficiently.

The light emitting elements used here can be any type that is commonly used in this field. For instance, a semiconductor layer such as ZnSe, GaP or a nitride semiconductor ($In_XAl_YGa_{1-X-Y}N$, $0 \leq X$, $0 \leq Y$, $X+Y \leq 1$) can be used as a blue or green light emitting element, and a semiconductor layer such as GaAlAs or AlInGaP can be used as a red light emitting element. A GaN-based semiconductor can be used to advantage.

The light emitting elements may be such that electrodes are disposed on different sides of the semiconductor layer, but they are preferably disposed on the same side. This allows mounting in a facedown form (discussed below).

A light emitting element in which a reflective film is formed over the entire side surface can also be used. This allows light to be reflected and extracted laterally from the light emitting element, so the light extract efficiency can be improved. Also, since there is no leakage of light from the light emitting element, there is no need to provide a reflective member between the light emitting elements. Examples of this reflective film include those made from the same material as the first light-shielding film, such as a single-layer of metal, or multilayer metal film, or a dielectric multilayer film. The reflective film is preferably formed in contact with the side surfaces of the light emitting element.

When the light emitting elements are spaced apart corresponding to the above-mentioned light distribution member, usually a plurality of light emitting elements are arranged on a support substrate in series, in parallel, in series-parallel, in parallel-series, etc. The light emitting elements are connected by using a joining member such as solder or the like, or wires or the like. The light emitting elements may be connected in either a face-down form or a face-up form, but a face-down form is preferable to use. This connection allows the light emitting element to be disposed in close proximity to or in contact with the light distribution member, and allows the desired light distribution characteristics to be easily obtained.

The transmissive pieces formed on one light distribution member can have the substantially similar configuration (shape, thickness, characteristics, etc.), or each transmissive piece can have a different configuration as shown in FIG. 7. For instance, the size of each transmissive piece can be changed, or each transmissive piece can be made to contain a different phosphor so as to produce light of different wavelengths, or the transmissive pieces can be formed in a stepped shape.

Layout of Reflective Member

Reflective member is preferably disposed between the light emitting elements. Providing the reflective member makes it less likely that light from the lit light emitting element can be incident on the transmissive pieces provided to unlit light emitting element. The reflective member is not essential components, however. For example, when using light emitting element in which reflective film is formed over the entire side faces of the light emitting element, the reflective member in not necessarily. The reflective member preferably reflects in a range of at least 60%, and more preferably in a range of at least 70%, further preferably in a range of at least 80% or at least 90%, of the light emitted from the light emitting element.

The material of the reflective member may be selected from those listed above as examples for the first light-shielding film, for example, but using, for example, a resin is preferable in view of accuracy, simplicity, and ease of layout of the reflective member.

Examples of the resin here include the same as those listed for the material of the transmissive plates, but it is particularly preferable for these materials to contain one of the above-mentioned reflective substances so that light emitted from the light emitting elements cannot be transmitted. The amount in which the reflective substance and so forth are contained can be suitably adjusted according to the type of reflective substance being used and so forth. For example, about 30% or more with respect to the total weight of the reflective member is preferable. A white resin is especially preferable.

The reflective member preferably fills the space surrounded by the light distribution member and the adjacent light emitting elements, regardless of whether or not there is an adhesive member for bonding the light distribution member to the light emitting element. Also, the reflective member is preferably disposed so as to be in contact with the light shield part (the first light-shielding films and/or the second light-shielding films) in the light distribution member in between adjacent light emitting elements. The contact here is preferably such that an entire light shield part exposed on the light emitting element side of the light distribution member is in contact with the reflective member. Also, the reflective member is preferably disposed so as to be in contact with the light-shielding frame around the outer periphery of each light emitting element. This allows the light emitted from the individual light emitting elements to be separated for each light emitting element, and prevents light leakage between adjacent light emitting elements within the light emitting device. As a result, this avoids the problem in which the transmissive pieces provided to unlit light emitting elements emit tiny amounts of light.

The reflective member needs not be disposed in contact with the side surfaces of the light emitting element, but is preferably disposed so as to be in contact with all or part of the side surfaces. This layout allows light emitted laterally from the side surfaces of the light emitting element to be reflected and taken off at the light extract surfaces. Also, providing the reflective member in contact with the side surfaces of the light emitting element means that the light can propagate only through the light emitting element, so light absorption by other members can be avoided.

The reflective member is preferably also disposed on the surface of the light emitting element on the opposite side from the light extract surface, that is, in between the light emitting element and the above-mentioned support substrate. This layout allows light to be extracted on the light extract surface side.

Furthermore, when part of the outer periphery of the first joined body, that is, the end surfaces of the first joined body, is not covered by the light-shielding frame, then the reflective member preferably cover at least the surfaces not covered by the light-shielding frame. This allows light moving laterally through the transmissive pieces to be reflected by the light-shielding frame and the reflective member. When the light-shielding frame is disposed all the way around the outer periphery of the first joined body, however, the outer periphery of the light-shielding frame need not be covered by the reflective member. This allows the outer periphery of the light distribution member to be the outermost periphery of the light emitting device, so the light emitting device can be more compact than when the reflective member is disposed on the side surfaces of the light distribution member. When the end surfaces of the first joined body are covered by the reflective member, then the upper surface of the reflective member and the upper surface of the light distribution member are preferably flush around the periphery of the light distribution member This allows light emitted from the side surfaces of the light distribution member to be reflected and emitted at the light extraction surface.

The reflective member can be formed by screen printing, potting, transfer molding, compression molding, or the like. The reflective member does not cover the surface on the light extract surface side in the manufactured light emitting device, but working may be performed in the reflective member formation step in which the surface of the light distribution member on the light extract surface side is first covered, after which the light extract surface of the light distribution member is exposed from the reflective member by polishing or the like.

The thickness of the reflective member is preferably equal to the total of the thickness of the light distribution member and the distance from the upper surface of the support substrate to the upper surface of the light emitting element when the light emitting element has been connected to the support substrate.

The disposition of the reflective member is preferably performed after the light emitting elements have been arranged with respect to the light distribution member, but depending on the above-mentioned layout mode, the reflective member may be disposed after the light emitting elements have been mounted on the support substrate and before the light distribution member is provided, for example.

The light emitting device obtained by this manufacturing method has at least one light distribution member. The light distribution member has, for example, a first main surface and a second main surface that are parallel to each other and located on opposite sides from each other, has transmissive pieces and light shield part disposed alternately with respect to a specific direction parallel to the first main surface and second main surface, and has a light-shielding frame which is disposed around the outer periphery of a joined body including the transmissive pieces and the light shield part. The light emitting device has a plurality of light emitting elements that are spaced apart and disposed on the lower surface side of the light distribution member corresponding to the transmissive pieces of these light distribution member, and reflective member that is disposed in between the light emitting elements in addition to the light distribution member (see FIGS. 2B and 4B). In other words, the light emitting device has light emitting elements that are disposed spaced apart, transmissive pieces that are provided to the emission surface side of these light emitting elements, light shield part that join adjacent transmissive pieces, and reflective member that is disposed between adjacent light emitting elements.

With this configuration, light emitted from the individual light emitting elements can be separated for each light emitting element, and light leakage between adjacent light emitting elements can be prevented within the light emitting device. As a result, this avoids the problem in which the transmissive piece provided to unlit light emitting element emits tiny amounts of light. Also, light leakage from the sides of the transmissive piece provided to the light emitting element located at the ends can be prevented, and light distribution can be controlled.

Figure 8:
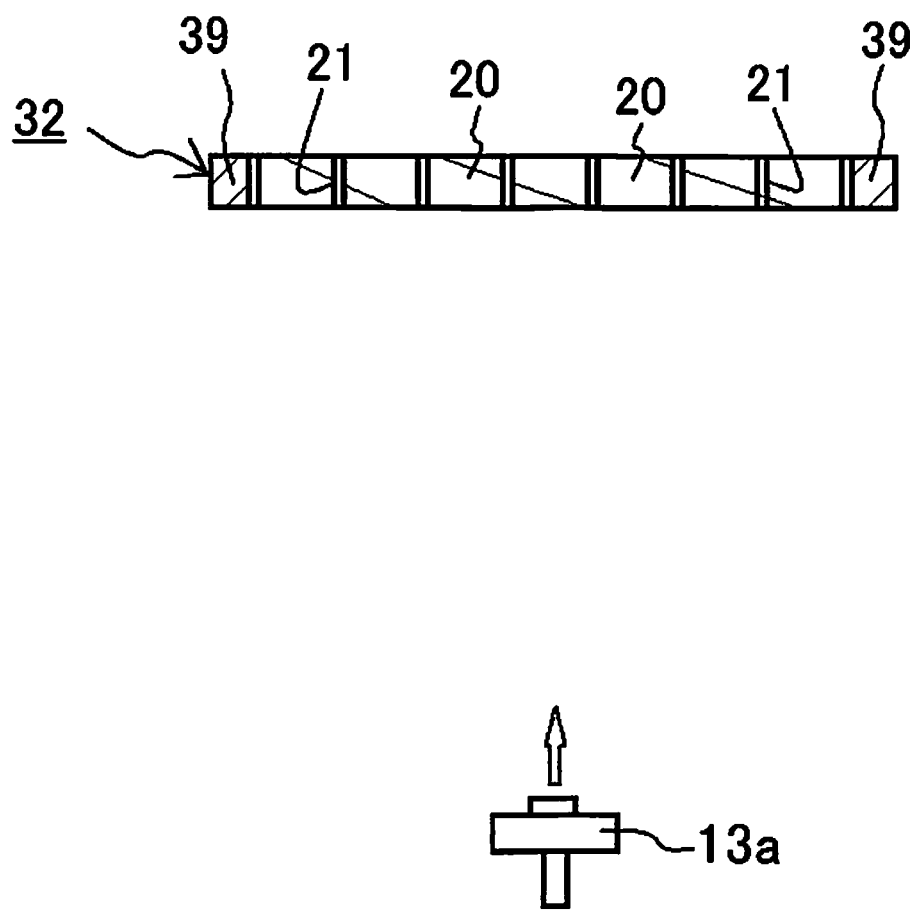
FIG. 8 is a schematic manufacturing step diagram indicating other embodiment of a method for manufacturing a light emitting device using the light distribution members obtained with the manufacturing method in FIGS. 1A to 1F.

As shown in FIG. 8, a semiconductor laser element (laser diode) can be used as a light emitting element 13. FIG. 8 shows a light distribution member 32 and a laser diode that are spaced apart from the light distribution member 32. The laser diode is disposed so that the light they emit will be incident on one of the two main surfaces of the light distribution member 32, the one on which the light-shielding frame 39 is not provided. Since a laser diode emits higher-density light than an LED, in the case that the transmissive pieces 20 contain a phosphor, the heat dissipation improvement effect of the present disclosure will be more pronounced for the above reason. When laser diodes are used, a transmission-type light distribution member can be obtained, in which the lower surface of the light distribution member 32 serves as the surface where light from the laser diodes is incident, and the upper surface of the light distribution member 32 serves as the light emission surface. In this case, unlike a reflection-type in which heat can be dissipated from the entire lower surface because a metal or the like is joined to the lower surface of the joined body, the side surfaces of the joined body are the sole heat dissipation path. Accordingly, the heat dissipation improvement effect provided by the light-shielding frame 39 is more pronounced when the light distribution member 32 is a transmission type.

A description is given of examples of a method for manufacturing a light distribution member and a method for manufacturing a light emitting device according to the embodiment based on the Figures below.

Embodiment 1: Method for Manufacturing Light Distribution Members

With a method for manufacturing a light distribution members in this Embodiment 1, first, a transmissive plate 10a is prepared as shown in FIG. 1A. This transmissive plate 10a is obtained by mixing a YAG phosphor in an amount of about 10 wt % into a glass material, sintering this mixture, and cutting the resulting large-sized YAG plate to the proper size.

As shown in FIG. 1B, a first light-shielding film 11a composed of a metal multilayer film (titanium, platinum, and gold, in that order starting from the transmissive plate side) is successively formed by sputtering in respective thicknesses of 100 nm, 200 nm, and 500 nm (for a total thickness of 800 nm) on only one side of this transmissive plate 10a, to form a first light-shielding film member 17. Two of these first light-shielding film members 17 are formed. Also, a plurality of first light-shielding film members 17 in which the first light-shielding film 11a is formed on both sides of the transmissive plate 10a are produced. The "one side" referred to here is the upper or lower surface of the transmissive plate 10a shown in FIG. 1A, and "both sides" indicates the upper and lower surfaces of the transmissive plate 10a shown in FIG. 1A.

Next, as shown in FIG. 1C, the first light-shielding film members 17 are successively joined at normal temperature so that the first light-shielding films 11a are opposite each other, to form a first joined body 18. In this embodiment, five of the first light-shielding film members 17 are joined. In this case, the surfaces located at the uppermost surface and the lowermost surface of the first joined body 18 are not provided the first light-shielding films 11a. Also, the light shield part 11 (here, the two first light-shielding films 11a) is disposed between the first light-shielding film members 17. In the first joined body 18, one surface that is perpendicular to the first light-shielding films 11a and is adjacent to the surfaces where the first light-shielding films 11a are not formed is termed the end surface F, and the end surface on the opposite side to the end surface F is termed the end surface R. The end surfaces F and R here have the smallest surface area of the surfaces perpendicular to the first light-shielding films 11a.

A light-shielding frame 19 is formed on the resulting first joined body 18. The light-shielding frame here is disposed so as to surround the entire outer periphery of the first joined body 18. In FIG. 1D, the light-shielding frame 19 is fixed to the surfaces except at the end surfaces F and R.

The light-shielding frame 19 is produced, for example, by joining a ceramic at normal temperature to the surfaces located at the uppermost and lowermost surfaces of the first joined body 18, and joining a ceramic at normal temperature to the exposed surfaces (of the faces perpendicular to the first light-shielding films 11a, the ones with the largest surface area) of the first joined body 18 except at the end surfaces F and R.

After this, as shown in FIG. 1E, the first joined body 18 surrounding the outer periphery of the light-shielding frame 19 is cut perpendicular to the joint surfaces of the first light-shielding film members 17 and all of the surfaces to which the light-shielding frame 19 is fixed so as to obtain the desired thickness. That is, the cutting is performed parallel to the end surfaces F and R of the first joined body 18. After this, polishing is performed to flatten out the surfaces.

Figure 1F:
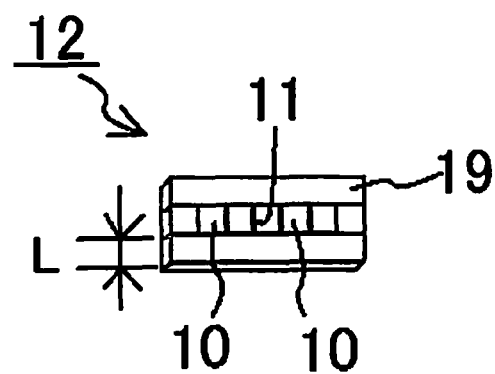

Consequently, as shown in FIG. 1F, a plurality of light distribution members 12 can be formed with the desired thickness which include the first joined body 18, which has a row of transmissive pieces 10 and light shield parts 11 (each light shield part 11 has two first light-shielding films 11a in this embodiment) that join the adjacent transmissive pieces 10, and the light-shielding frame 19 disposed all the way around the outer periphery of the first joined body 18.

As shown in FIGS. 1A and 1B, the thickness of the transmissive plates 10a becomes the maximum width at which the light emitting elements can eventually be disposed. Therefore, the thickness of the transmissive plates 10a is preferably greater than one side (the width) of a light emitting element in plan view, and can be, for example, at least 50 μm greater than one side of the light emitting element.

With this light distribution member 12, since the light-shielding frame 19 (composed of ceramic) is provided around the outer periphery of the first joined body 18, the light distribution member 12 can have excellent resistance to light and heat. Also, since substantially no organic substance is contained on the inside of the light-shielding frame 19, any heat produced by the transmissive pieces 10 can be easily dissipated to the light-shielding frame 19. Furthermore, with this embodiment, a light distribution member 12 with excellent resistance to heat and light can be formed very simply.

Embodiment 2: Method for Manufacturing Light Emitting Device

Figure 2A:
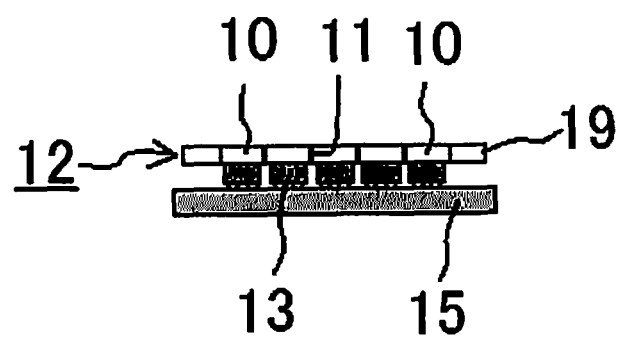
FIGS. 2A and 2B are schematic manufacturing step diagrams indicating an embodiment of a method for manufacturing a light emitting device using the light distribution members obtained with the manufacturing method in FIGS. 1A to 1F.

With a method for manufacturing a light emitting device in Embodiment 2, as shown in FIG. 2A, light emitting elements 13 are disposed corresponding to one light distribution member 12 obtained in Embodiment 1. That is, five light emitting elements 13 are disposed spaced apart and corresponding to the respective positions of the transmissive pieces 10 segmented by the light shield parts 11 of the light distribution member 12.

The light emitting elements 13 are mounted on a support substrate 15 of which a wiring pattern has been formed on the upper surface in a face-down form in a row by soldering. The light distribution member 12 is then fixed with an adhesive member to the light extract surface side of the light emitting elements 13 thus disposed.

Figure 2B:
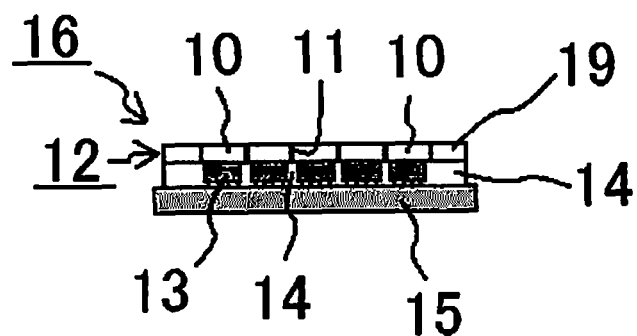

Then, as shown in FIG. 2B, a light emitting device 16 is formed by disposing reflective member 14 that include a silicone resin containing about 50% titanium dioxide so as to be disposed between the light emitting elements 13 and between the light emitting elements 13 and the support substrate 15. The reflective member 14 is provided so as to be in contact with the light shield part 11 between the light emitting elements 13. Also, the reflective member 14 is disposed so as to cover entire lower surface of the light distribution member 12 and all of the side surfaces of the light emitting elements 13 except for the regions where the light emitting elements 13 and the light distribution members 12 are in contact. Also, at the side surfaces of the light emitting device 16, the side surfaces of the light-shielding frame 19 are flush with the side surfaces of the reflective member 14.

The light emitting device obtained by this manufacturing method has the light distribution member 12, which has a joined body (here, the first joined body 18) in which a plurality of transmissive pieces 10 are joined via the light shield part 11, and the light-shielding frame 19 provided so as to surround the outer periphery of the joined body as seen in one direction; a plurality of light emitting elements 13 disposed on one of the pair of main surfaces on which the light-shielding frame 19 is not provided of the light distribution member 12; and the reflective member 14 that is composed of a different material from that of the light-shielding frame 19 and are provided so as to be in contact with the light shield part 11 between the light emitting elements. The light distribution member 12 and the light emitting elements 13 here are disposed so that the light from one light emitting element 13 can be incident on one or more of the transmissive pieces 10.

With the above manufacturing method, there is no need to form a reflective or light-shielding film on the side surfaces of the light distribution member, and a light emitting device can be manufactured accurately and simply.

Also, with this light emitting device, when the lighting of the individual light emitting elements is controlled independently, it is less likely that light from a lit light emitting element can leak to transmissive pieces provided to adjacent unlit light emitting elements. Consequently, the transmissive piece provided to unlit light emitting element can be prevented from emitting tiny amounts of light. Furthermore, since the thickness of the light-shielding part located between light emitting elements can be reduced, even if adjacent light emitting elements emit light at the same time, a uniform brightness can be ensured at the boundary. In addition, a brighter and more compact light emitting device can be manufactured in which the light emitting elements are disposed closer together. Also, light leakage in the lateral direction of the light emitting elements located at the ends of the light emitting device can be prevented, and good light distribution characteristics can be obtained.

Embodiment 3: Method for Manufacturing Light Distribution Members

With a method for manufacturing light distribution members in Embodiment 3 is substantially the same as the method for manufacturing light distribution members in Embodiment 1, except that the transmissive plates are cut in two directions.

First, a transmissive plate 20a is prepared as shown in FIG. 3A.

Then, as shown in FIG. 3B, a first light-shielding film 21a composed of a multilayer metal film is formed on the surface of this transmissive plate 20a to form a first light-shielding film member 27. The width of the first light-shielding film member 27 in this case shall be about 200 μm, for example. The width referred to here indicates the length W in the lateral direction in FIG. 3B.

Next as shown in FIG. 3C, for example, five of the first light-shielding film members 27 is successively joined at normal temperature so that the first light-shielding films 21a are opposite, thereby forming a first joined body 28 that is laminated five of the first light-shielding film members 27. In the first joined body 28, one surface that is perpendicular to the first light-shielding films 21a and is adjacent to the surfaces where the first light-shielding films 21a are not formed is termed the end surfaces F, and the end surfaces on the opposite side to the end surface F is termed the end surfaces R. The end surfaces F and R here have the smallest surface area out of the surfaces perpendicular to the first light-shielding films 21a.

As shown in FIG. 3D, a light-shielding frame 29 is formed on the resulting first joined body 28. The light-shielding frame 29 here is disposed so as to surround the entire outer periphery of the first joined body 28. In FIG. 3D, the light-shielding frame 29 is fixed to the surfaces except at the end surfaces F and R.

After this, as shown in FIG. 3E, the first joined body 28 whose outer periphery is surrounded by the light-shielding frame 29 is subjected to a first cut perpendicular to the joint surfaces of the first light-shielding film members 27 and all the surfaces to which the light-shielding frame 29 is fixed. That is, the cutting is performed parallel to the end surfaces F and R of the first joined body 28. After this, polishing is performed to flatten out the surfaces. This yields the light distribution member 22a shown in FIG. 3F.

As shown in FIG. 3G, the cut light distribution member 22a is also cut again perpendicular to the joint surfaces of the first light-shielding film members 27, which is also perpendicular to the above-mentioned first cut at the joint surfaces of the first light-shielding film members 27.

Thus cutting in two directions allows a plurality of light distribution members 22 to be manufactured in the desired shape and with the light shield part 21 disposed between adjacent transmissive pieces 20. With the light distribution members 22, however, the light-shielding frame 29 does not go all the way around the outer periphery, and is disposed only on a pair of side surfaces or on a pair of side surfaces and one other side surface.

When cuts are thus made in two directions, it is preferable for the transmissive plates 20a to have the depth shown in FIG. 3A.

With this manufacturing method, just as in Embodiment 1, a large quantity of light distribution members with which light leakage can be prevented between adjacent light emitting elements can be manufactured by a simple method at high accuracy.

Embodiment 4: Method for Manufacturing Light Emitting Device

Figure 4A:
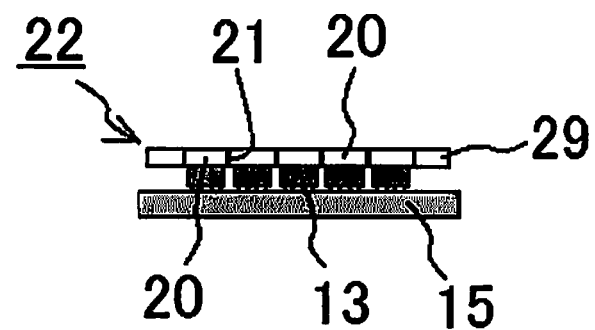
FIGS. 4A and 4B are schematic manufacturing step diagrams indicating an embodiment of a method for manufacturing a light emitting device using the light distribution members obtained with the manufacturing method in FIGS. 3A to 3G.

As shown in FIG. 4A, with a method for manufacturing a light emitting device in Embodiment 4, light emitting elements 13 and a light distribution member 22 are disposed in the same manner as in Embodiment 2.

Figure 4B:
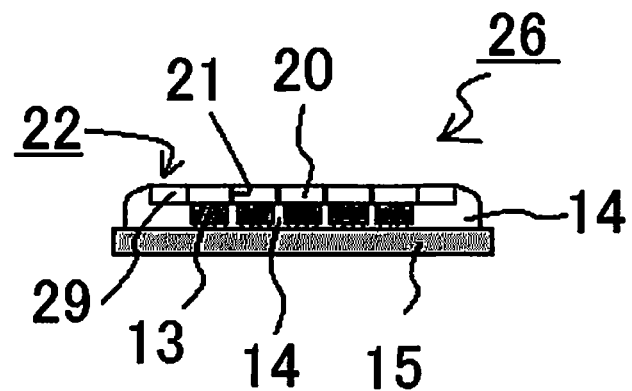

Then, as shown in FIG. 4B, the reflective member 14 is disposed between the light emitting elements 13, etc. The reflective member 14 is provided so as to be in contact with the light shield part 21 (here, the two first light-shielding films 21a) in between the light emitting elements 13. The reflective member 14 is disposed so as to cover the entire lower surface of the light distribution member 12 except for the region where in contact with the light emitting elements 13, the side surfaces of the light distribution member 12, and all of the side surfaces of the light emitting elements 13. That is, the reflective member 14 is disposed so as to cover all of the side surfaces of the light-shielding frame 29. At the upper surface of the light emitting device 26, the upper surface of the light-shielding frame 29 is flush with the upper surface of the reflective member 14.

The above manufacturing method allows light distribution member and a light emitting device to be manufactured simply and accurately, without having to form reflective or light-shielding films on the side surfaces of the light distribution member, just as in Embodiment 2.

Embodiment 5: Method for Manufacturing Light Distribution Members

Figure 5A:
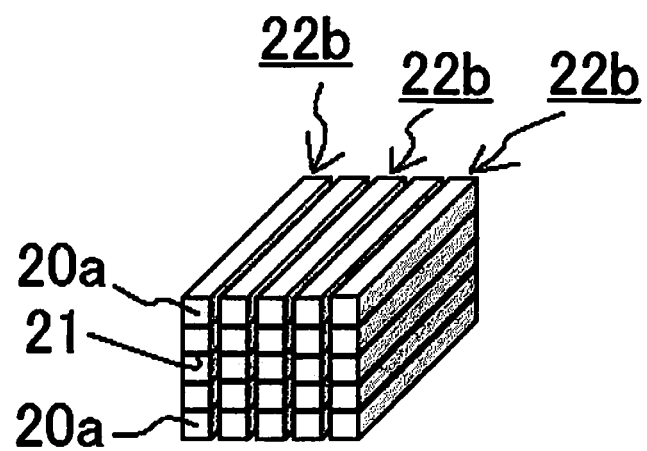
FIGS. 5A to 5G are schematic manufacturing step diagrams indicating still another embodiment of a method for manufacturing a light distribution member of the present disclosure.
Figure 5B:
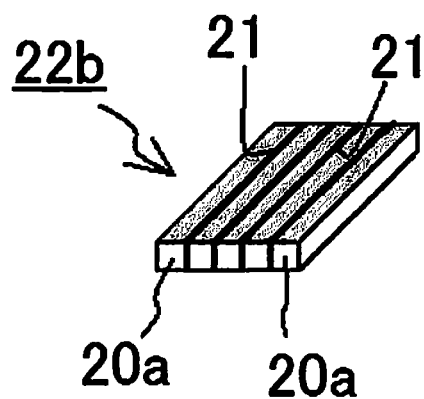

With a method for manufacturing light distribution members in Embodiment 5, the first joined body 28 shown in FIG. 3C in Embodiment 3 is cut perpendicular to the joint surfaces of the first light-shielding film members 27 as shown in FIG. 5A, forming intermediates 22b as shown in FIG. 5B. This cut is made perpendicular to the end surfaces F and R.

Figure 5C:
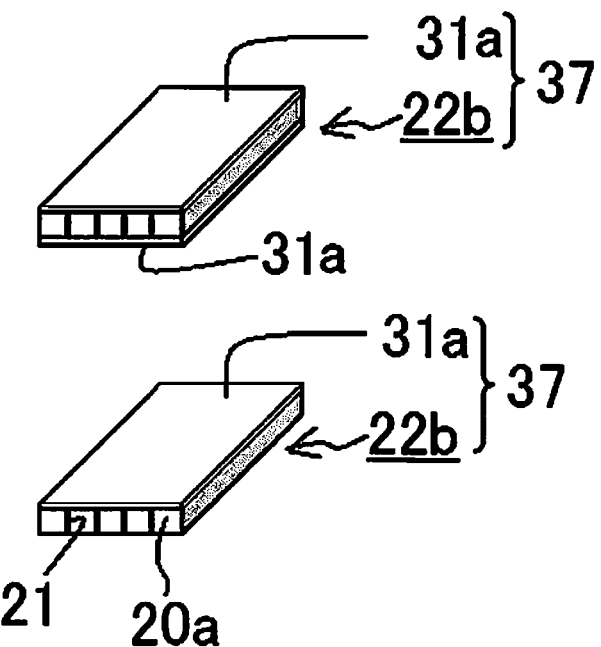

Then, as shown in FIG. 5C, a second light-shielding film 31a composed of a multilayer metal film, just as in the formation of the first light-shielding film 21a, thereby forming a second light-shielding film member 37.

Figure 5D:
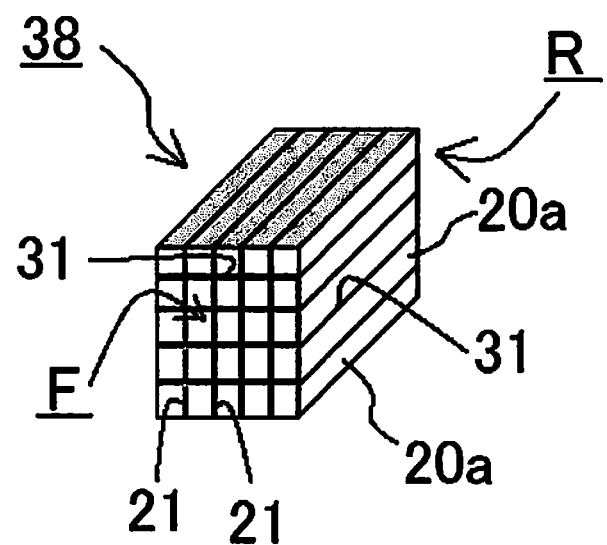

As shown in FIG. 5D, for example, five of the second light-shielding film members 37 are successively joined at normal temperature so that the second light-shielding films 31a are opposite, thereby forming a second joined body 38 that includes five of the second light-shielding film members 37. In the second joined body 38, one surface that is perpendicular to the first light-shielding films 21a and the second light-shielding films 31a and is adjacent to the surfaces where the second light-shielding films 31a are not formed is termed the end surface F, and the end surface on the opposite side to the end surface F is termed the end surface R. The end surfaces F and R here have the smallest surface area of the surfaces perpendicular to the second light-shielding films 31a.

Figure 5E:
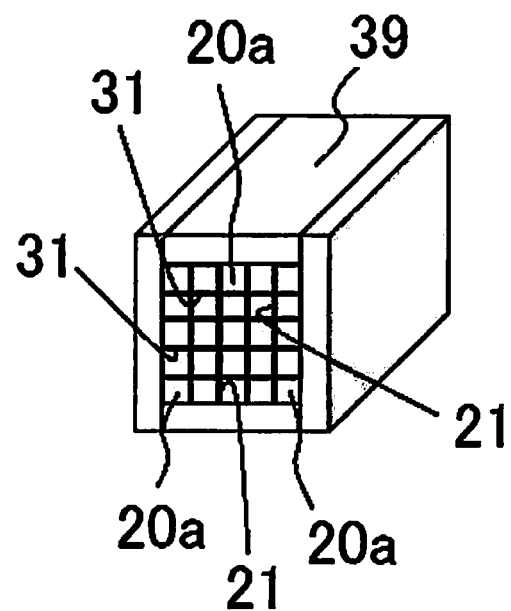

As shown in FIG. 5E, a light-shielding frame 39 is formed on the resulting second joined body 38. The light-shielding frame 39 here is disposed so as to surround the entire outer periphery of the second joined body 38. In FIG. 5E, the light-shielding frame 39 is fixed to the surface except at the end surfaces F and R.

Figure 5F:
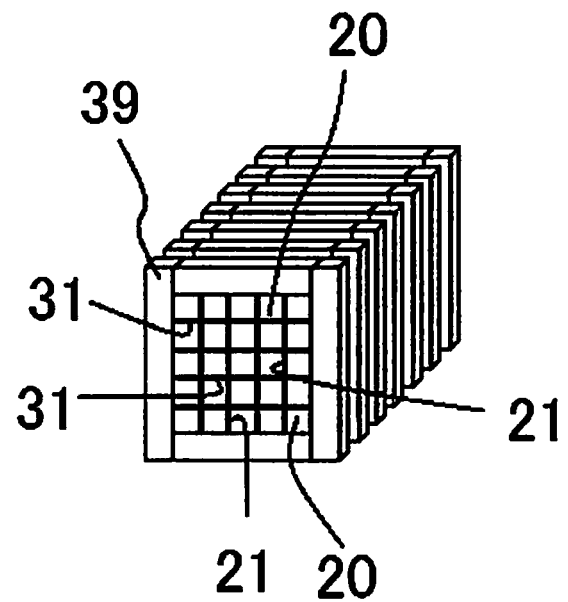

Then, as shown in FIG. 5F, the second joined body 38 whose outer periphery is surrounded by the light-shielding frame 39 is cut perpendicular to all the surfaces to which the light-shielding frame 39 is fixed. That is, the cutting is performed parallel to the end surfaces F and R of the second joined body 38.

Figure 5G:
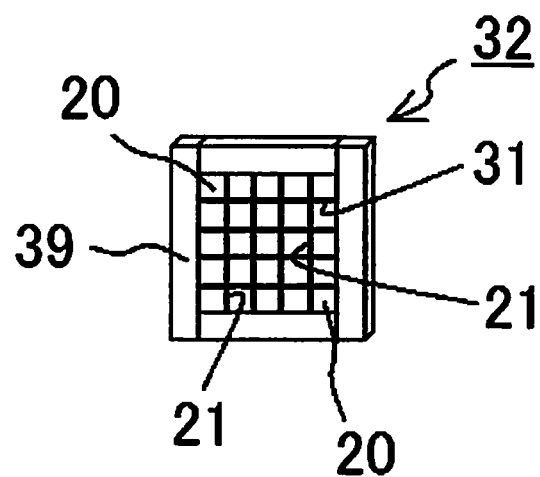

After this, if needed, the resulting light distribution members 32 are polished and/or cut to manufacture a light distribution member 32 of the desired shape as shown in FIG. 5G, for example. In this light distribution member 32, a plurality of the transmissive pieces 20 are disposed in a matrix. The light shield part 21 composed of two first light-shielding films 21a are disposed between transmissive pieces 20 that are adjacent in the row direction, and light shield part 31 composed of two second light-shielding films 31a are disposed between transmissive pieces 20 that are adjacent in the column direction.

With this manufacturing method, just as in Embodiments 1 and 3, a large quantity of light distribution members with which light leakage can be prevented between adjacent transmissive pieces can be manufactured by a simple method at high accuracy.

Embodiment 6: Method for Manufacturing Light Emitting Device

Figure 6:
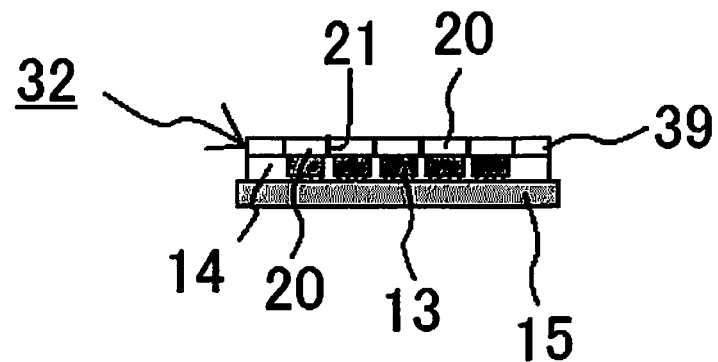
FIG. 6 is a schematic manufacturing step diagram indicating an embodiment of a method for manufacturing a light emitting device using the light distribution members obtained with the manufacturing method in FIGS. 5A to 5G.

As shown in FIG. 6, with a method for manufacturing a light emitting device in Embodiment 6, a plurality of light emitting elements 13 are disposed in a matrix corresponding to the light distribution member 32 obtained in Embodiment 5.

The arrangement of the light emitting elements 13 here can be the same as in Embodiment 2, and a light emitting device can be manufactured by forming a reflective member by the same method as in Embodiment 2.

The light emitting device obtained with this manufacturing method is configured substantially the same as the light emitting device in Embodiment 2, except that the light emitting elements are disposed in a matrix, the transmissive pieces are disposed corresponding to these light emitting elements, and light shield part (in this embodiment, the first light-shielding films and second light-shielding films) is disposed between adjacent the transmissive pieces.

With the above manufacturing method, the light emitting device can be manufactured simply and accurately, without having to form reflective or light-shielding films on the side surfaces of the light distribution member, just as in Embodiments 2 and 4.

Embodiment 7: Method for Manufacturing Light Distribution Members

With this method for manufacturing light distribution members, first
  transmissive plates A that are the thinnest and have the highest phosphor concentration,
  transmissive plates B that are the thinnest and have the second highest phosphor concentration,
  transmissive plates C that are the second thinnest and have the highest phosphor concentration,
  transmissive plates D that are the thickest and have the second highest phosphor concentration, and
  transmissive plates E that are the thickest and have the lowest phosphor concentration are prepared in order to manufacture light distribution members 42 for the light emitting device in FIG. 7A.

Using transmissive plates A and B, a joined body X is produced in which transmissive pieces 41a and 41b are arranged in the row direction, just as in the steps up to FIG. 1C in Embodiment 1.

Using transmissive plates D and E, a joined body Y is produced in which transmissive pieces 41d and 41e are arranged in the row direction, just as in the steps up to FIG. 1C in Embodiment 1.

Using transmissive plates B and C, a joined body Z is produced in which transmissive pieces 41b and 41c are arranged in the row direction, just as in the steps up to FIG. 1C in Embodiment 1.

These joined bodies X, V, and Z are treated as the intermediates shown in FIG. 5B, and light-shielding films are formed on their surfaces in the same manner as in FIG. 5C. After this, just as in FIG. 5D, these are laminated in a direction perpendicular to the row direction. Then, just as in FIG. 5E, a light-shielding frame 49 is formed, and cuts as in FIG. 5F.

As shown in FIG. 7A, this formed a light distribution member 42 that has transmissive pieces 41a having the smallest size and the highest phosphor concentration, transmissive pieces 41b having the smallest size and the second highest phosphor concentration, transmissive pieces 41c having the second smallest size and the highest phosphor concentration, transmissive pieces 41d having the largest size and the second highest phosphor concentration, and transmissive pieces 41e having the largest size and the lowest phosphor concentration, and in which the light-shielding frame 49 is formed around the outer periphery of these.

Embodiment 8: Method for Manufacturing Light Emitting Device

As shown in FIG. 7B, this method for manufacturing a light emitting device allows the same light emitting device as in Embodiment 6 to be manufactured, except that light distribution member 42 is used in place of the light distribution member 32, one light emitting element 13 is arranged in correspondence with one of the transmissive pieces 41a and 41 b with the smallest size, two light emitting elements 13 are arranged in correspondence with the transmissive piece 41c with the second smallest size, and four light emitting elements 13 are arranged in correspondence with the transmissive pieces 41d and 41e with the largest size.

This light emitting device has the same effect as in Embodiments 2, 4, and 6. When light distribution member with this configuration is used, light emitting device can be obtained whose characteristics match various applications, such as automotive headlights.

INDUSTRIAL APPLICABILITY

The method for manufacturing the light distribution member and the light emitting device of the present invention can be used for the manufacturing of a variety of light sources, such as a display-use light source, a lighting-use light source, various kinds of indicator-use light source, a light source mounted in a vehicle, display-use light source, a light source for a liquid crystal backlight, automotive parts, outdoor channel letters, and the like.

It is to be understood that although the present disclosure has been described with regard to preferred embodiments thereof, various other embodiments and variants may occur to those skilled in the art, which are within the scope and spirit of the invention, and such other embodiments and variants are intended to be covered by the following claims.

What is claimed is:
1. A light distribution member comprising:
a body including a plurality of transmissive pieces and a plurality of light shield parts each interposed between adjacent ones of the transmissive pieces, each of the transmissive pieces being made of a phosphor, or of a sinter of a phosphor and a binder composed of an inorganic substance; and
a light-shielding frame provided so as to surround an outer edge periphery of the body, the light-shielding frame being made of a ceramic,
wherein the light distribution member contains substantially no organic substance inside the light-shielding frame.
2. The light distribution member according to claim 1, wherein
the transmissive pieces and the light shield parts are arranged to form a matrix.
3. The light distribution member according to claim 1, wherein
a width of the light-shielding frame, in a direction parallel to a major surface of the body, is within a range of from 50 to 1000 μm.
4. The light distribution member according to claim 1, wherein
the transmissive pieces have different thicknesses.
5. A light emitting device comprising:
the light distribution member according to claim 1;
a plurality of light emitting elements that are arranged on a main surface of the light distribution member, the main surface being a surface on which the light-shielding frame is not provided, and that are disposed so that light from one of the light emitting elements is incident on one or more of the transmissive pieces of the light distribution member; and
a reflective member that is made of a different material from a material of the light-shielding frame and is provided so as to come into contact with the light shield part between the light emitting elements, the reflective member being in contact with all or a part of side surfaces of each of the light emitting elements.
6. The light emitting device according to claim 5, wherein the reflective member covers all outer side surfaces of the light-shielding frame.
7. The light emitting device according to claim 5, wherein the transmissive pieces and the light shield parts are arranged to form a matrix.
8. The light emitting device according to claim 5, wherein a width of the light-shielding frame, in a direction parallel to a major surface of the body, is within a range of from 50 to 1000 μm.
9. The light emitting device according to claim 5, wherein the light emitting elements and the light distribution member are joined without another member interposed therebetween.
10. The light emitting device according to claim 9, wherein
the light emitting elements are flush with the light distribution member along a joining surface between the light emitting elements and the light distribution member.
11. A method for manufacturing a plurality of light distribution members, comprising:

preparing a joined body in which a plurality of transmissive plates are joined with a light shield part being interposed between adjacent ones of the transmissive plates, each of the transmissive pieces being made of a phosphor, or of a sinter of a phosphor and a binder composed of an inorganic substance;

fixing a light-shielding frame to the joined body so as to surround an outer periphery of the joined body as seen from one direction, the light-shielding frame being made of a ceramic; and cutting the joined body and the light-shielding frame perpendicularly to a surface of the joined body to which the light-shielding frame is fixed thereby obtaining the plurality of the light distribution members each having a plurality of transmissive pieces, wherein the light distribution member contains substantially no organic substance inside the light-shielding frame.

12. The method for manufacturing a plurality of light distribution members according to claim 11, wherein
in the step of preparing the joined body, the transmissive plates are joined with the light shield part and interposed therebetween, to form a matrix.

13. The method for manufacturing a plurality of light distribution members according to claim 11, wherein,
in the step of preparing the joined body, a first light-shielding film which has at least one of a single layer composed of metal, and a multilayer film composed of at least one of metal and a dielectric is formed on at least one surface of each of the transmissive plates respectively, and the plurality of transmissive plates are joined together so that the first light-shielding films are opposite each other.

14. A method for manufacturing a light emitting device, comprising:
manufacturing the light distribution members by the method according to claim 11; and
providing a plurality of light emitting elements that are spaced apart so that light from one of the light emitting elements is incident on at least one of the transmissive pieces of one of the light distribution members.

15. A method for manufacturing a light emitting device, comprising: manufacturing the light distribution members by the method according to claim 11; and
providing a plurality of light emitting elements that are spaced apart so that light from one of the light emitting elements is incident on at least one of the transmissive pieces of one of the light distribution members.

16. The method for manufacturing a light emitting device according to claim 15, further comprising
providing a reflective member that is made of a different material from a material of the light-shielding frame, so as to come into contact with the light shield part between the light emitting elements after the providing of the plurality of the light emitting elements.

17. The method for manufacturing a plurality of light distribution members according to claim 11, wherein
in the step of preparing the joined body, a first light-shielding film which has at least one of a single layer composed of metal, and a multilayer film composed of at least one of metal and a dielectric formed on at least one surface of each of the transmissive plates respectively, and the transmissive plates are joined together so that the first light-shielding films are opposite each other.

18. The method for manufacturing a plurality of light distribution members according to claim 17, wherein
in the step of preparing the joined body, the first light-shielding film includes the multilayer film composed of dielectric.

19. The method for manufacturing a plurality of light distributions member according to claim 17, wherein
in the step of preparing the joined body, the first light-shielding film includes the multilayer film composed of dielectric and metal film, and the transmissive plates are joined together by directly joining with metal layers of the first light-shielding films being opposite each other.

* * * * *